United States Patent [19]

Grunstra et al.

[11] Patent Number: 5,706,881
[45] Date of Patent: Jan. 13, 1998

[54] HEAT TREATMENT OF SUPERALLOY CASTING WITH PARTIAL MOLD REMOVAL

[75] Inventors: Robert E. Grunstra, Muskegon; Julie A. Faison, Whitehall; Jacqueline B. Wahl, Muskegon, all of Mich.

[73] Assignee: Howmet Research Corporation, Whitehall, Mich.

[21] Appl. No.: 801,168

[22] Filed: Feb. 18, 1997

Related U.S. Application Data

[63] Continuation of Ser. No. 241,658, May 12, 1994, abandoned.

[51] Int. Cl.$^6$ ............... C30B 33/02; C22F 1/02; C22F 1/10; B22D 21/06
[52] U.S. Cl. ............. 164/76.1; 164/122.1; 164/122.2; 164/516; 148/555; 148/562
[58] Field of Search ................. 64/76.1, 516, 517, 64/122.1, 122.2, 131, 132; 117/2, 3; 148/555, 556, 562

[56] References Cited

U.S. PATENT DOCUMENTS

| | | | |
|---|---|---|---|
| 4,031,945 | 6/1977 | Gigliotti et al. | 164/792 |
| 4,069,043 | 1/1978 | Ackermann | 75/232 |
| 4,385,939 | 5/1983 | Kortovich et al. | 148/562 |
| 4,434,835 | 3/1984 | Ford et al. | 164/122.2 |
| 4,853,044 | 8/1989 | Ford et al. | 148/555 |
| 5,077,141 | 12/1991 | Naik et al. | 148/562 |
| 5,100,484 | 3/1992 | Wukusich et al. | 148/562 |
| 5,226,946 | 7/1993 | Diehm et al. | |

FOREIGN PATENT DOCUMENTS

| | | | |
|---|---|---|---|
| 1440492 | 6/1976 | United Kingdom | 164/122.1 |

OTHER PUBLICATIONS

Chemical Compatibility of Ceramics for Directionally Solidifying Ni–Base Eutectic Alloys; Ceramic Bulletin, vol. 58, No. 5 (1979), pp. 527–535; Huseby, et al.

*Primary Examiner*—George Wyszomierski
*Assistant Examiner*—Margery S. Phipps
*Attorney, Agent, or Firm*—Edward J. Timmer

[57] ABSTRACT

A method of making a single crystal or columnar grain superalloy casting comprises casting a superalloy in a mold wherein at least one of the mold and optional core comprises an oxygen-bearing ceramic, directionally solidifying the superalloy to form a single crystal or columnar grain superalloy casting, and solution heat treating the superalloy casting. The heat treatment is conducted under an atmosphere including a carbon-bearing gas, such as a carbon monoxide and inert gas mixture, wherein the carbon-bearing gas is present in an effective amount to reduce loss of carbon from the casting during the heat treatment. The heat treatment can be conducted prior to removal of all of the mold and core, if present, such as, for example, when the cast mold is in the as-knocked out condition wherein residual mold and/or core material is present on the casting. Alternately, the heat treatment can be conducted after removal of the mold and core, if present.

7 Claims, No Drawings

HEAT TREATMENT OF SUPERALLOY CASTING WITH PARTIAL MOLD REMOVAL

This application is a continuation of U.S. Ser. No. 08/241 658 filed May 12, 1994, now abandoned.

FIELD OF THE INVENTION

The present invention relates to manufacture of superalloy castings and, more particularly, to casting of superalloys followed by high temperature heat treatment of the castings without detrimental loss of carbon therefrom.

BACKGROUND OF THE INVENTION

In the production of hollow single crystal superalloy castings, such as internally cooled single crystal turbine blades and vanes, for gas turbine engines, a ceramic investment mold cluster having a plurality of article (e.g. blade or vane-shaped) molding cavities and a respective ceramic core located in each cavity is filled with molten superalloy and subjected to well known directional solidification techniques to propagate a single crystal or grain through the melt in each article molding cavity to form a plurality of solidified single crystal superalloy castings devoid of grain boundaries which are known to detract from the high temperature mechanical properties of the castings. Solid single crystal superalloy castings are produced in similar manner without, however, the need for the aforementioned ceramic core located in each article molding cavity.

Following casting, past practice has been to subject the as-cast mold cluster to a post casting processing cycle that includes a knock-out operation wherein the as-cast mold cluster is mechanically struck at a region to be removed from the finished castings (i.e. at a region that does not include the castings themselves) in a manner to remove a majority of the ceramic shell mold material from the castings and a gating removal operation wherein a portion or all of the excess gating is removed from the castings by cutting or other mechanical techniques. The remainder of the ceramic shell mold material and the ceramic cores are then removed from the castings by a further shell cleaning operation (e.g. a so-called shell bath in an aqueous caustic solution) and a core removal operation. One technique for removing the ceramic cores embedded in the castings involves an autoclave technique in which the cleaned castings (after removal of most shell material) are immersed in an aqueous caustic solution at elevated temperature and pressure for a time to dissolve away the cores, leaving hollow single crystal castings. Another core removal technique involves immersion of the cleaned castings in a molten caustic salt material.

After the ceramic shell mold material and cores are removed, past practice has been to solution heat treat the castings under conditions of high temperature and time (e.g. between 2350° and 2400° F. for at least 30 minutes). The solution heat treatment typically has been conducted under a non-reactive atmosphere of argon. Following heat treatment, the single crystal castings are subjected to metallurgical testing for crystal structure, cleaning and final machining as well as a lower temperature aging heat treatment, e.g. see U.S. Pat. No. 5,100,484.

However, solution heat treatment of the single crystal castings pursuant to the casting processing cycle described above is disadvantageous. In particular, the single crystal castings in the non-heat treated condition are subjected to the post casting processing cycle and are subjected to bumps, bangs, and other mechanical impacts from handling and the post casting processing operation. Upon high temperature solution heat treatment of the castings above the recrystallization temperature, these prior mechanical impacts have resulted in development of unacceptable grain conditions in the single crystal castings, such as, for example, grain recrystallization regions in the casting microstructure.

It would be desirable to solution heat treat the single crystal castings as early as possible in the post casting processing cycle prior to handling and mechanical impacting of the castings so as to reduce or avoid development of the aforementioned unacceptable grain conditions or regions in the casting microstructure. However, attempts to solution heat treat the castings early in the post casting processing cycle; e.g. in the as-knocked out condition (i.e. prior to removal of all of the ceramic shell mold material and ceramic core), using conventional solution heat treat parameters have been unsuccessful due to detectable loss of carbon from the castings at regions (e.g. airfoil and root) of the castings that are tested for carbon concentration pursuant to customer specifications. Carbon loss has been more pronounced at thinner airfoil regions than thicker root regions in general. Also, silicon pick-up by the castings has been detected when silica based shell mold and/or core materials are used in the casting operation.

It is an object of the present invention to provide a method of making a superalloy casting in a manner to reduce detrimental loss of carbon as a result of a post casting high temperature heat treatment operation.

It is another object of the invention to conduct a high temperature heat treatment early in the post casting processing cycle without loss of alloy carbon so that development of the aforementioned unacceptable grain conditions in the casting microstructure can be reduced or minimized.

SUMMARY OF THE INVENTION

The present invention provides a method of making a superalloy casting including the steps of casting a superalloy in a mold wherein at least one of the mold and optional core comprises an oxygen-bearing ceramic, solidifying the superalloy to form a superalloy casting, and heat treating the superalloy casting wherein, in accordance with the present invention, the heat treatment is conducted under an atmosphere comprising a carbon-bearing gas present in an effective amount to reduce loss of carbon from the casting during heat treatment.

In one embodiment of the invention, the carbon-bearing gas comprises a mixture of an inert gas, such as argon, and carbon monoxide present in an effective amount to reduce loss of carbon from the casting during heat treatment. The gas mixture can be supplied to the heat treat furnace having about 3 to about 20% by volume CO with the balance argon at a total gas mixture pressure in the heat treat furnace of about 100 to 2000 microns and above.

In another embodiment of the invention, the superalloy is cast in an oxygen-bearing ceramic mold and is heat treated prior to removal of all of the mold and core, if present. For example, the superalloy casting can be heat treated in the as-knocked out condition. Alternately, in another embodiment of the invention, the superalloy casting is heat treated after removal of all of the mold and core, if present.

The present invention is particularly useful, although not limited, in making single crystal and columnar grain superalloy castings using known directional solidification techniques including the steps of casting the superalloy in a mold wherein at least one of the mold and optional core comprises an oxygen-bearing ceramic and directionally solidifying the superalloy to form a single crystal or columnar grain superalloy casting. The casting is solution heat treated early in the post casting processing cycle and under an atmosphere comprising the aforementioned carbon-bearing gas in an effective amount to reduce carbon loss from the casting during heat treatment. For example, an as-cast mold cluster can be subjected to a knock-out operation to remove a major portion of the shell mold, leaving a residual minor portion of shell mold material at regions of the casting, and then the casting is heat treated using the heat treat atmosphere comprising the above mentioned effective amount of carbon-bearing gas. Directionally solidified (single crystal and columnar grain) castings made in accordance with the invention have carbon concentrations comparable to those of the as-cast superalloy before heat treatment.

The above described objects and advantages of the invention will become more fully apparent from the following detailed description of the invention.

DESCRIPTION OF THE INVENTION

Although the present invention will be described in detail herebelow with respect to manufacture of single crystal superalloy castings using known directional solidification techniques, the invention is not so limited and may have applicability in the manufacture of superalloy castings having columnar grain structures by known directional solidification techniques and equiaxed superalloy castings as well. The present invention can be practiced to make castings comprising nickel base superalloy and nickel/cobalt base superalloy compositions for such gas turbine components as turbine blades and vanes and other components subjected to high temperature and stress during engine operation. However, the present invention is not limited to practice with respect to any particular superalloy composition.

One illustrative embodiment of the present invention involves conventionally investment casting a superalloy melt of selected alloy composition into a conventional ceramic investment shell mold cluster made by the lost wax process. In the manufacture of single crystal castings, a grain starter cavity is provided at the bottom of each article molding cavity of the mold cluster proximate a water-cooled chill plate on which the mold cluster rests. When the mold cluster is filled with superalloy melt, a plurality of grains are nucleated and propagate upwardly in each starter cavity toward a crystal selector. The crystal selector may comprise a so-called pigtail that is operative to select one of the upwardly propagating grains for further propagation through each article molding cavity to form a single crystal casting. Alternately, a seed crystal may be located in each starter cavity to nucleate and propagate a single crystal through each article molding cavity. Single crystal casting molds and processes are known and described in the Pieracey U.S. Pat. No. 3,494,709, the teachings of which are incorporated herein by reference, and numerous other patents.

In the manufacture of hollow single crystal castings (e.g. single crystal turbine blades or vanes having one or more internal cooling passages), a ceramic core is located in each article (e.g. blade or vane-shaped) molding cavity in a manner to form one or more internal passages upon core removal during post casting processing cycle. The use of ceramic cores to this end is well known and described in U.S. Pat. Nos. 3,596,703, 3,659,703, 4,487,246 and 4,811, 778, the teachings of which are incorporated herein by reference.

The investment shell mold and ceramic core, if used, can be made of ceramic materials selected in dependence upon the superalloy composition being cast in order to provide adequate mold and core strength and minimize adverse melt/mold/core reactions during casting. A ceramic material typically employed in manufacture of a single crystal investment shell mold cluster for turbine blades or vanes comprises an oxygen-bearing ceramic or mixtures or combinations of such ceramics formed by the well known lost wax technique wherein an assembly of fugitive patterns (e.g. wax pattern) of the components to be cast is repeatedly dipped in a slurry comprising a binder and suitable ceramic powder, drained and then stuccoed with a suitable dry ceramic stucco until the shell mold is built-up to desired thickness. The investment mold is fired at for example 1400–1800° F. and preheated to an appropriate temperature prior to casting the superalloy melts therein. Oxygen-bearing ceramic materials useful in practicing the invention include for purposes of illustration and not limitation zircon, alumina, magnesia, zirconia, yttria, silica, and other oxygen-bearing ceramics well-known in the art of investment shell mold formation and casting as well as mixtures or combinations thereof. For example, silica bonded zircon, silica bonded alumina, and the like are commonly used with stucco layers including zircon, alumina, and the like as outer layers to form the mold structural body while silica bonded yttria is used as an inner mold facecoat for contacting the superalloy melt. When silica is present in the mold structure, silica is less stable than zircon and alumina relative to the carbon of the superalloy at high temperatures of heat treatment of the castings as will be further explained.

Similarly, oxygen-bearing ceramic material typically employed in the manufacture of cores for casting hollow single crystal turbine blades includes, but is not limited to, alumina based ceramic materials, silica based ceramic materials and others well-known in the art of ceramic core manufacture and casting.

For purposes of further illustration rather than limitation, a nickel base superalloy (known as N5) consisting essentially of, in weight %, 5–10% Cr, 5–10% Co, 0–2% Mo, 3–10% W, 3–8% Ta, 0–2% Ti, 5–7% Al 0–6% Re, 0–0.5% Hf, 0–0.07% C, 0–0.015% B, 0–0.075% Y and balance nickel (see U.S. Pat. No. 5 100 484) can be cast and directionally solidified as a single crystal turbine blade or vane using the well known mold withdrawal technique in an investment shell mold cluster comprising a silica bonded yttria mold facecoat backed by back-up layers comprising alternating layers of dried silica bonded alumina slurry and dried silica bonded zircon slurry each stuccoed with tabular alumina with a respective fired alumina based core in each blade or vane-shaped (article) molding cavity of the mold cluster. The fired core comprises about 13.3 volume % magnesium aluminate spinel, about 11.9 volume % yttria alumina garnet and the balance alumina. When silica is present in the mold and/or core structure, it is less stable than zircon and alumina relative to the carbon of the superalloy at high temperatures of solution heat treatment of the castings. Zircon, in turn, is less stable with respect to alloy carbon than alumina during heat treatment.

In accordance with one embodiment of the present invention, a solution heat treatment of the castings is conducted early in the post casting processing cycle under conventional temperature and time conditions (e.g. a solution heat treat temperature between 2350 and 2425° F. for at least 30 minutes) to homogenize the cast microstructure. For example, the cast mold cluster can be subjected to a conventional shell mold removal operation, such as, for example, a knock-out operation, water blast operation or other shell removal operation, to remove a major portion of the shell mold cluster, leaving only a residual portion of the shell mold material from the castings. The residual mold material typically represents a minor portion of the shell mold material initially and is present in non-uniform manner on the castings. For example, residual mold material may be present on some regions of the castings but not at other regions of the castings, and the residual mold material may be present at different thicknesses on some regions than other regions of the castings.

A typical knock-out operation involves striking the cast mold cluster with a hammer at an appropriate location (e.g. at the gating region, starter cavity region or pour cup region) that will be removed from the directionally solidified castings (e.g. removed from the single crystal blade or vane castings). A majority of the shell mold material typically is removed in this manner.

Alternately, the solution heat treatment can be conducted even earlier in the post casting processing cycle, such as on the as-cast mold cluster prior to any knock-out and gating removal operations. However, heat treatment of the castings after some type of shell removal operation to remove some mold material; e.g. in the knocked-out condition, is preferred in order to reduce mess and handling problems associated with falling off of loose shell mold materials during the post casting processing cycle.

When the solution heat treatment is conducted early in the post processing cycle, the superalloy casting will be subjected to elevated temperatures for selected times in contact with the residual oxygen-bearing ceramic mold material and/or oxygen-bearing ceramic core material embedded in the casting. As mentioned, either the shell mold or the core, or both, can include oxygen-bearing ceramic material(s) used in their manufacture and thus can be present on the castings when the heat treatment is conducted early in the post casting processing cycle.

The present invention involves the recognition that the detrimental loss of carbon heretofore observed in previous attempts to solution heat treat the single crystal castings at an early stage of the post casting processing cycle (e.g. in the knock-out condition) could be attributable to a reaction between the oxygen-bearing ceramic material(s) present in the residual mold material and/or core and the carbon of the superalloy. For example, for the specific silica bearing mold materials described above used in single crystal casting of the N5 nickel base superalloy and thus present on the castings in the as knocked out condition, a reaction can occur during solution heat treatment as follows: $SiO_2+C=Si+CO_2$, although the inventors do not wish to be bound by any theory in this regard. This type of carbon oxidation reaction could explain the observed loss of carbon in single crystal castings made in silica bearing, or more generally, other oxygen bearing ceramic, molds/cores during heat treatment at this stage of the post casting processing cycle, although again the inventors do not wish to be bound by any theory to this end.

In accordance with the present invention, the aforementioned solution heat treatment can be conducted early in the post casting processing cycle provided that the heat treat atmosphere is selected to reduce or minimize the loss of carbon in the castings by reducing the driving force of a carbon oxidation reaction that otherwise might occur between residual oxygen-bearing ceramic mold and/or core material and the carbon of the castings at the high temperatures of heat treatment. In particular, the solution heat treatment of the single crystal castings is conducted under a heat treat atmosphere comprising a carbon-bearing gas present in an amount effective to reduce the driving force of a carbon oxidation reaction that might otherwise occur at the high temperatures of heat treatment.

For purposes of illustration rather than limitation, an atmosphere comprising carbon monoxide or a mixture of an inert gas, such as argon or other inert gas, and effective amount of carbon monoxide can be used to practice the invention to reduce loss of carbon from the casting and concomitant increase in silicon during the heat treatment when a silicon-bearing ceramic, such as silica, is present as residual mold and/or core material on the castings. For example, when the heat treat atmosphere comprises an inert gas/carbon monoxide gas mixture, the atmosphere supplied to the heat treat furnace comprises carbon monoxide in an amount of about 3 to about 20 % by volume and the balance inert gas, such as argon.

For purposes of illustration rather than limitation, a particular exemplary gas mixture used as an atmosphere for solution heat treatment of the aforementioned single crystal N5 turbine blade or vane castings at 2360–2365° F. for 2 hours comprised 10 volume % carbon monoxide and balance argon supplied premixed from a conventional supply cylinder or bottle to the heat treat furnace. The as-supplied 10%CO/Ar gas mixture was calculated to provide a CO partial pressure in the heat treat furnace of approximately 17.5 microns. The Ar/CO gas mixture pressure in the heat treat furnace was 175 microns during some heat treat trials and 2000 microns during other trials as measured by a Convectron Model GP-275 (Argon/Nitrogen) measuring device (switched to argon calibration) available from Granville-Phillips Co., Boulder, Colorado. The invention is not limited to any particular inert gas/CO total gas mixture pressure in the heat treat furnace, however. Inert gas/CO total gas mixture pressures in the furnace ranging from 100 to 2000 microns and above can be used in practice of the invention.

When the single crystal turbine blades or vanes made of the specific nickel base superalloy (N5) described above were solution heat treated in the knocked-out condition in the manner described above, the carbon and silicon concentrations in the heat treated castings were found to be comparable to those in the as-cast blades or vanes (i.e. prior to heat treatment). Moreover, metallographic evaluation of the heat treated castings revealed no concentration of carbides at the surface of the castings. Temperature/time parameters for solution heat treatment and aging heat treatment the aforementioned N5 nickel base superalloy are set forth in U.S. Pat. No. 5,100,484, the teachings of which are incorporated herein by reference.

In accordance with another embodiment of the present invention, in lieu of solution heat treating the single crystal casting(s) early in the post casting processing cycle as described above, the castings instead can be solution heat treated in the manner described after all or most of the shell material and cores, if present, are removed from the castings. Heat treatment at this stage of the post casting processing cycle may be advantageous to maintain alloy chemistry, particularly the carbon concentration, within prescribed range.

Although the invention has been described in terms of specific embodiments thereof, it is to be understood that modifications and changes can be made thereto within the scope of the invention as set forth in the appended claims.

The embodiments of the invention in which an exclusive property or privilege is claimed are defined as follows:

1. A method of reducing occurrence of unacceptable recrystallized grain regions in making a directionally solidified superalloy casting, comprising casting a superalloy in a mold in which an optional core may be present, at least one of the mold and optional core comprising an oxygen-bearing ceramic, directionally solidifying the superalloy to form a single crystal or columnar grain solidified casting, and conducting a post casting treatment that includes removing a portion of the mold from the solidified casting and then subjecting the solidified casting with a remainder of said mold on the casting to a solution heat treatment, said solution heat treatment being conducted in an atmosphere comprising a carbon bearing gas present in an effective amount to reduce loss of carbon by oxidation of said casting from a carbon oxidation reaction between said oxygen-bearing ceramic and said casting during said solution heat treatment.

2. The method of claim 1 wherein the superalloy is cast in an oxygen-bearing ceramic mold.

3. The method of claim 1 wherein the portion of the mold is removed by a knock out operation.

4. The method of claim 2 wherein the superalloy is in contact with an oxygen-bearing ceramic core.

5. The method of claim 2 wherein said carbon bearing gas comprises a mixture comprising about 3 to 20% by volume of carbon monoxide and the balance inert gas.

6. The method of claim 1, wherein said atmosphere has a pressure of about 100 microns and above.

7. A method of reducing occurrence of unacceptable recrystallized grain regions in making a single crystal superalloy casting, comprising casting a superalloy in a mold in which an optional core may be present, at least one of the mold and optional core comprising an oxygen-bearing ceramic, directionally solidifying the superalloy to form a single crystal superalloy casting, and subjecting the mold with the solidified casting therein to a post casting treatment including a mechanical knock-out operation to remove a portion of said mold from the casting, leaving a residual portion of said mold on the solidified casting, and subjecting the solidified casting in the as-knocked-out condition to a solution heat treatment, said solution heat treatment being conducted in an atmosphere comprising a carbon bearing gas present in an effective amount to reduce loss of carbon by oxidation of said casting from a carbon oxidation reaction between said oxygen-bearing ceramic and said casting during said solution heat treatment.

\* \* \* \* \*